United States Patent [19]
Kim et al.

[11] Patent Number: 5,516,726
[45] Date of Patent: May 14, 1996

[54] METHOD OF MANUFACTURING LOCAL INTERCONNECTION FOR SEMICONDUCTORS

[75] Inventors: Paul S. Kim, Wappingers Falls; Seiki Ogura, Hopewell Junction, both of N.Y.

[73] Assignee: International Business Machines Corporation, Armonk, N.Y.

[21] Appl. No.: 343,150

[22] Filed: Nov. 22, 1994

Related U.S. Application Data

[62] Division of Ser. No. 285,592, Aug. 3, 1994, abandoned, which is a continuation of Ser. No. 47,764, Apr. 15, 1993, abandoned, which is a continuation of Ser. No. 809,458, Dec. 17, 1991, abandoned.

[51] Int. Cl.⁶ ................................................. H01L 21/283
[52] U.S. Cl. ..................... 437/189; 437/192; 437/228
[58] Field of Search .................................. 437/189, 192, 437/195, 228, 228 ES, 238; 257/750, 763, 764

[56] References Cited

U.S. PATENT DOCUMENTS

| 4,451,328 | 5/1984 | Dubois . | |
|---|---|---|---|
| 4,617,723 | 10/1986 | Mukai . | |
| 4,780,429 | 10/1988 | Roche et al. . | |
| 4,908,679 | 3/1990 | Vora et al. . | |
| 4,983,544 | 1/1991 | Lu et al. | 437/200 |
| 4,985,750 | 1/1991 | Hoshino | 257/761 |
| 5,069,748 | 12/1991 | Przybysz | 156/643 |
| 5,098,860 | 3/1992 | Chakravorty et al. | 437/195 |
| 5,180,688 | 1/1993 | Bryant et al. | 437/195 |
| 5,206,187 | 4/1993 | Doan et al. | 437/192 |
| 5,208,170 | 5/1993 | Kobeda et al. | 437/34 |
| 5,256,597 | 10/1993 | Gambino | 437/189 |
| 5,397,744 | 3/1995 | Sumi et al. | 437/200 |

OTHER PUBLICATIONS

Elliot, Constitution of Binary Alloys, "Ti-Oxygen," McGraw Hill Co., 1965, pp. 697–698.
Li et al., "Study of Oxygen Behavior . . . ", J. Vac. Sci. Technol., B6(6), Nov./Dec. 1988, pp. 1714–1720.
Veendrick et al., "An Efficient and Flexible . . . " IEEE J. Solid State Circuits, 25(5), Oct. 1990, pp. 1153–1157.
Wang et al., "Oxygen Sinks in Reaction . . . " Thin Solid Films, 202, pp. 105–123, Jan. 1991.

*Primary Examiner*—T. N. Quach
*Attorney, Agent, or Firm*—Harold Huberfeld; Kris V. Srikrishnan

[57] ABSTRACT

A process, compatible with bipolar and CMOS processes, for making local interconnection of adjacent devices on a semiconductor substrate is disclosed. An electrically insulating etch stop layer is deposited over the semiconductor substrate including the device contact openings. A conductive layer is deposited over the etch stop layer. The conductive layer is patterned into a local interconnect by use of resist patterning and subtractive etching, stopping on the etch stop layer. By thermal activation, the conductive pattern and the underlying insulating material interact to become a single electrically conductive layer. This layer also establishes electrical contact to the devices thus completing the formation of the local interconnection of the devices on a semiconductor substrate.

5 Claims, 4 Drawing Sheets

STUD OR VIA   WIRE

STUD OR VIA   WIRE

METHOD OF MANUFACTURING LOCAL INTERCONNECTION FOR SEMICONDUCTORS

This is a Divisional Patent Application of Ser. No. 08/285,592 filed on Aug. 3, 1994, abandoned, which is a continuation of Ser. No., 08/047,764, Apr. 15, 1993, abandoned, which is a continuation of Ser. No. 07/809,458 Dec. 17, 1991, abandoned.

FIELD OF THE INVENTION

This invention is generally in the area of semiconductor manufacturing, and specifically in the area of local interconnect wiring for electrically connecting adjacent devices on an integrated circuit chip.

BACKGROUND OF THE INVENTION

A continuing trend in semiconductor technology is to build integrated circuit chips with more and faster circuits on the chip. The drive toward this ultra large scale integration, has resulted in continued shrinking of features, with the result that a large number of devices are available on a chip. To take advantage of this large number of devices and form them into a large number of circuits, the various devices have to be interconnected. The ability to connect as many devices as possible is called wirability, which is the percentage of the available devices on the chip that can be connected together to form usable circuits.

The term "interconnect" as used herein, refers to any electrically conductive element such as a wire or a strap connecting two parts of the circuits. Depending on the circuits, the length of the interconnects can vary. Short interconnects connect adjacent devices, and longer interconnects connect devices further apart thus forming more complex circuits, and also making connections to Input/Output devices and power supplies. In general, there is a range and distribution of lengths of the interconnect used on a chip. In addition, the interconnects must be electrically insulated from each other except where designed to make contact. Multilevel wiring planes or levels are used, with each wiring level electrically isolated by an insulator from another wiring level. Electrical connection between wires on different planes is made where desired through the use of sloped or vertical holes in the insulator. Hence, the interconnects have both horizontal elements, referred to as "wires", and vertical elements referred to as "studs" or "vias". Studs or vias connect wires in different wiring planes. When a vertical and horizontal interconnect member contact each other, it is important how they intersect each other. Referring to FIG. 1B, the vertical element can be fully overlapped or covered by the horizontal element at the point of intersection. This is called a "bordered contact". Alternatively, as shown in FIG. 1A, the two elements can merely cross each other thereby providing some nominal contact area at the intersection. This is called a "borderless contact".

Wirability is affected by the design constraints that govern whether bordered or borderless contacts are used. These constraints are often imposed by process limitations or reliability needs with respect to the contacts being designed. For a given set of minimum space/wire size, maximum wirability is achieved by use of borderless contacts, as the wires and spaces can be designed to the smallest features and spaces allowed. In contrast, wirability is adversely affected by constraints that require bordered contacts, since larger surface areas are required for the contacts as seen in FIG. 1B. Bordered contacts provide intersection areas larger than the stud cross section areas.

Designers, in laying out the wiring, use the wiring level immediately above the device surface to make the local connections of essentially adjacent devices to form the basic circuits (see for example, "An efficient and flexible architecture for high density gate arrays", by Veendrick, H.J.M et al., IEEE J. Solid State Circuits, Vol. 25, No. 5, pp. 1153–1157). The other wiring levels are then used for connecting the basic circuit blocks to each other to form more complex circuits and ultimately leading to the input/output terminals of the chips for distributing power and information signals to the devices. A local interconnection level can improve wiring efficiency and reduce the number of total wiring levels that would be otherwise required. The electrical resistivity required for this interconnect wiring is dependent on the specific applications, the type of circuit and the transistor device, bipolar or FET. The electrical resistivity specification determines the thickness and the choice of the material for the local interconnect.

A key process difficulty associated with the formation of the local interconnect is the topography of the device surface. The device surface is quite non-planar, and the device contacts, such as the emitter, base and collector are in general at different elevations. In the case of FETs, the gate is at a different elevation than the source and drain. In addition, the device forming processes, such as recessed oxide isolation, shallow trenches and other process steps, create topographical irregularities (hereinafter called steps) between device contacts on the surface. A good local interconnect process, must provide good step coverage and also should be high yielding, producing a minimum number of defects that cause open and short circuits. A lift-off process using sacrificial resist stencils, can be used to fabricate borderless contacts; however lift-off processes tend to be limited to deposition temperatures of less than 200° C., and thus limiting the choice of materials to those that can be directionally deposited. A conductor thus deposited by a lift-off process, tends to have poor (or thinner) step coverage, making the interconnect unreliable or open over steps. A subtractive process is therefore often preferred, wherein a blanket film is deposited by chemical vapor deposition (CVD), sputtering or plasma enhanced CVD techniques. The blanket film is then subtractively etched into a desired pattern by using a resist mask. A major problem in subtractive etching of a conductive film over the aforementioned topography, is the occurrence of residual metal, sometimes called "stringers", that result from the incomplete etching of films at the steps, thereby causing electrical shorts. Extended over-etching is often required to reduce or eliminate these shorts.

It would be particularly valuable in the art, especially as it relates to the local interconnection of devices on a semiconductor substrate, for a method to be provided that would form a conductor having low electrical resistivity, with minimal shorting and good conductor coverage over steps, and furthermore would allow the use of borderless intersections in the design.

OBJECTS OF THE INVENTION

An object of the present invention is the provision of a high yielding, manufacturable process, for forming a local interconnect on a device surface containing steps.

Another object of the present invention is the provision of a process that will allow the use of borderless intersections for improved wirability.

Yet another object of the present invention is the provision of a process that allows overetching of the local interconnect without damage to any underlying silicon layers.

A further object of the invention is the provision of a local interconnect that has resistivity which is typically lower than the resistivity of silicides or polysilicon.

Still another object of the present invention is the provision of a process that is compatible with semiconductor manufacturing especially that of bipolar and CMOS devices.

SUMMARY OF THE INVENTION

Accordingly a process is provided for making local interconnection of devices on a semiconductor substrate. A substrate with devices and openings to contact the devices is provided. A layer of electrically insulating, etch stop material is deposited over the entire surface. Another layer of electrically conducting material is deposited over the etch stop layer. A local interconnect pattern is defined on the conducting layer by resist masking and subtractive etching of the conductive layer, stopping the etching on the etch stop layer. The resist mask is then removed. The conductive pattern and the etch stop layer underneath and in contact with it, are then subjected to a thermal activation process, thereby altering the electrically insulating etch stop layer underneath the conductive pattern to an electrically conductive layer. This establishes the local connection of the devices.

BRIEF DESCRIPTION OF THE DRAWINGS

The objects, features and advantages of the invention will be apparent from the following more particular description of the invention as illustrated in the accompanying drawings, in which.

DETAILED DESCRIPTION OF THE INVENTION

Figure 1A:
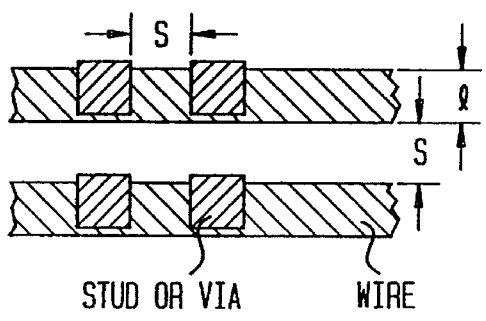
FIGS. 1A and 1B illustrate borderless and bordered contacts, respectively, as used in semiconductor interconnections.
Figure 1B:
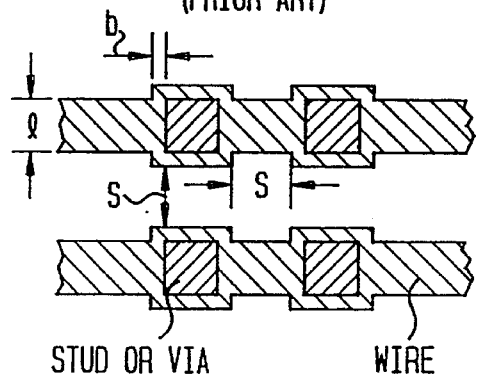

Referring now to the drawings, FIGS. 1A and 1B illustrate two examples of prior designs of the intersection of a horizontal element, i.e., a wire, and a vertical element, i.e., a stud or via. The intersection shown in FIG. 1B, is a bordered contact, as defined earlier, wherein the vertical contact is fully covered or overlapped by the horizontal interconnect. The border required to compensate for overlay, alignment and process tolerance is shown as b. In the case of the bordered contact, the intersect area is the full cross sectional area of the vertical interconnect. Thus the via, stud or the contact is completely covered by the wire, thereby protecting the stud material from the etching process used to define the wiring. It can also be seen that in this case, the minimum space between studs is larger than space s by 1 to 2 times the border width b, depending on whether the studs are staggered or next to each other. The intersection shown in FIG. 1A, in contrast to FIG. 1B, is a borderless contact, wherein the stud and wire features are designed to minimum line/space ground rules and substantially intersect. In this case, the wire does not fully cover the entire stud or contact region, hence the wire forming process can damage the unprotected surface of the stud, via or contact region. The most common unprotected contact surface involved in the formation of local interconnection is single or polycrystal silicon and on occasion can be Ge, silicides, GaAs, etc. depending on specific device compositions.

Figure 2:
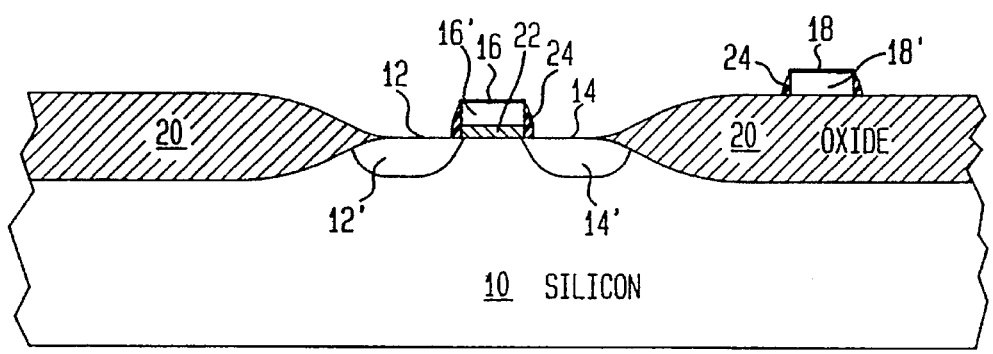
FIGS. 2, 3, 4, 5 and 6A cross sectional views illustrating consecutive steps in the formation of the local interconnect in accordance with the present invention.

With reference to FIG. 2, the cross section of a semiconductor substrate 10 is shown along with device contact surfaces 12, 14, 16 and 18. The transition from surfaces 12 to 16 and the sidewall spacer 24, constitute a typical example of a step, as discussed in the background of the invention. In this particular example, a field effect transistor is illustrated with diffused source and drain regions 12' and 14' respectively, a gate electrode 16', a polysilicon strap 18', a side wall insulator 24, a gate oxide 22 and a shallow trench or recessed oxide 20. For a bipolar or a different device, not illustrated here, there will be device contacts to emitter, base and collector at different elevations, to which the present invention can be applied in the same way as described in the following drawings.

Figure 3:
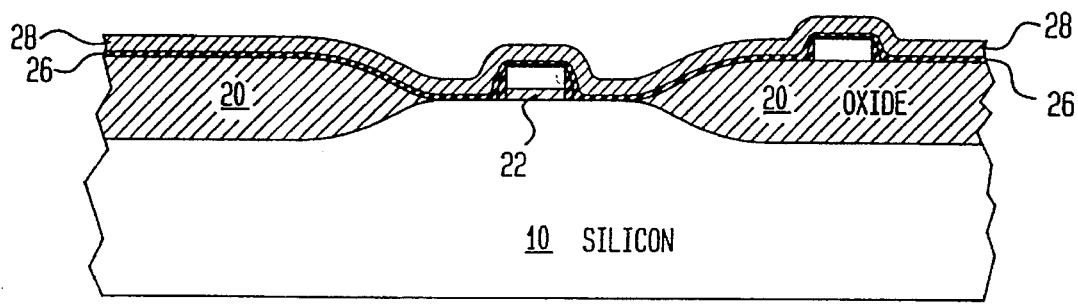

With reference to FIG. 3, the entire surface of the substrate as described in FIG. 2, is coated with a first layer 26, and then a second layer 28, both of which have unique attributes and provide unique functions, as discussed in the following sections. Layer 26 is electrically insulating as deposited and provides electrical insulation between the device regions 12', 14', 16' and 18'. The second layer 28 is electrically conducting and is made up of a single or multiple layers of thin conducting films. Layers 26 and 28 are deposited preferably by techniques that lead to conformal coatings over the topography, such as physical or reactive sputtering, CVD, plasma enhanced CVD (PECVD), etc. One of the attributes of layer 26 is that it changes from insulating to conducting, in the presence of layer 28, and when subjected to an activation process as described below. Thus the bilayer structure consisting of layers 26 and 28, on some suitable activation, such as heating, electrical pulsing etc., transforms from two distinct layers, one electrically insulating and the other electrically conducting, to a single electrically conducting layer. This transformed conducting layer, by itself, however can physically consist of multilayers or a single layer with multiphases (i.e, areas of different structural compositions), randomly distributed. In the case of multilayers, each discrete layer is electrically conducting; however, in the case of a single layer, the layer can be made of insulating phases distributed in an otherwise electrically conducting body of material.

Accordingly, layer 26 can be made of any of a wide range of materials such as oxides, nitrides, carbides etc., with the only restriction being that the selected material change from insulating to conducting, when in contact with layer 28 and when subjected to an appropriate activation process. Layer 28 can be made of any of the metals such as Al, Ti, V, Zr, Hf etc. or the corresponding metallic silicides. However, only certain combinations of materials can be selected for layer 26 and layer 28, to fulfill the requirement of conversion to a conductive layer on activation. In a preferred example of such a combination, layer 26 is $SiO_2$ and layer 28 is titanium. Table 1 lists some experimental results showing how a multilayer-stack of $Ti/SiO_2/Si$ behaves on heating to an elevated temperature for a specific period of time. In the examples shown in Table 1, the thickness of Ti was kept constant at 500 Angstroms, the thickness of $SiO_2$ was varied as shown and Si represents a silicon substrate. The thermal activation in these examples was provided by rapid thermal heating. However, other heating techniques such as furnace heating and radiating with a laser or energy source will provide similar results. The electrical sheet resistivity of the stacked layers after the heat cycle is also listed in Table 1. Since the sheet resistivity of the titanium layer alone is about 11 ohm/square, a lower value for the sandwich structure implies that the $SiO_2$ intermediate layer has been converted to a conductive layer, resulting in a lower resistivity as the titanium and silicon layers are now in electrical contact. At high temperatures, the titanium layer reacts with $SiO_2$ by dissolving the oxygen in the $SiO_2$ and also by forming titanium silicide.

TABLE 1

| $SiO_2$ THICKNESS | RTA °C. | TIME SEC. | Ω/SQUARE |
| --- | --- | --- | --- |
| 121Å | 800 | 60 | 3.9 |
| 134Å | 800 | 90 | 3.4 |
| 18Å | 650 | 30 | 9.2 |
| 129Å | 800 | 60 | 4.3 |
| 80Å | 650 | 60 | 9.0 |
| 420Å | 800 | 60 | 30 |

Figure 7:
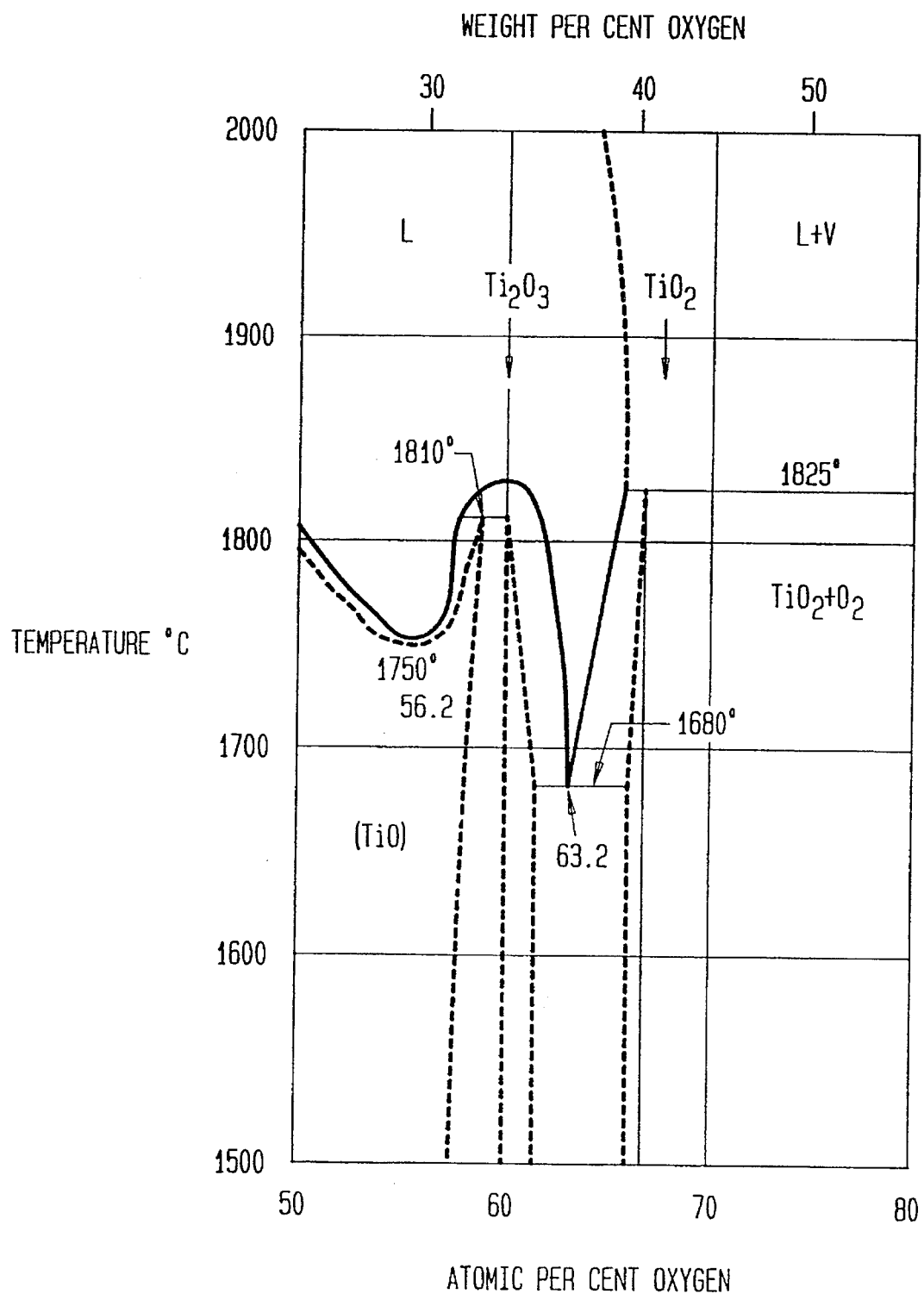
FIG. 7 is a phase diagram of titanium and oxygen which is used to explain some of the features of the invention.

Referring to FIG. 7, a titanium and oxygen phase diagram is shown, wherein it is seen that the metallic titanium phase can dissolve a large quantity of oxygen in its structure without forming an insulating titanium oxide phase. Zirconium, hafnium, vanadium etc., are similar to titanium in their reaction to $SiO_2$, while metals such as chromium and tantalum do not reduce $SiO_2$ on heating. However, a high solubility for oxygen is not always required in the reaction of metals with insulating films. An extensive study, by S. Q. Wang and J. W. Mayer, in Thin Solid Films, 202 (1991), pp. 105 to 123, of reaction of $SiO_2$ in contact with single and double metal films, concludes that the free energy change of the reaction at a given temperature determines if the reaction will occur. Thus, the choice of gas ambients during the heating, such as oxygen for carbide insulating films and hydrogen for oxide and nitride insulating films, can influence the free energies and favor the reactions between the two layers. Other mechanisms can lead to the same overall electrical effect, described earlier. For example, the conducting layer can physically break up the thin insulating layer by penetration (diffusion), thus establishing electrical contact to the substrate as required by this invention. Laser heating, can melt momentarily the top metallic layer, and thereby increase its reactivity many fold. It is evident from Table 1 and the above discussions, that for completion of this conversion reaction, the thickness of the insulator layer should be kept at a minimum. On the other hand, the thickness has to be sufficient to provide for a satisfactory etch stop. In general, the thickness of the intermediate insulating film is chosen in the range of 50 to 500 angstroms, with the preferred thickness for $SiO_2$ being about 100 angstroms.

Figure 4:
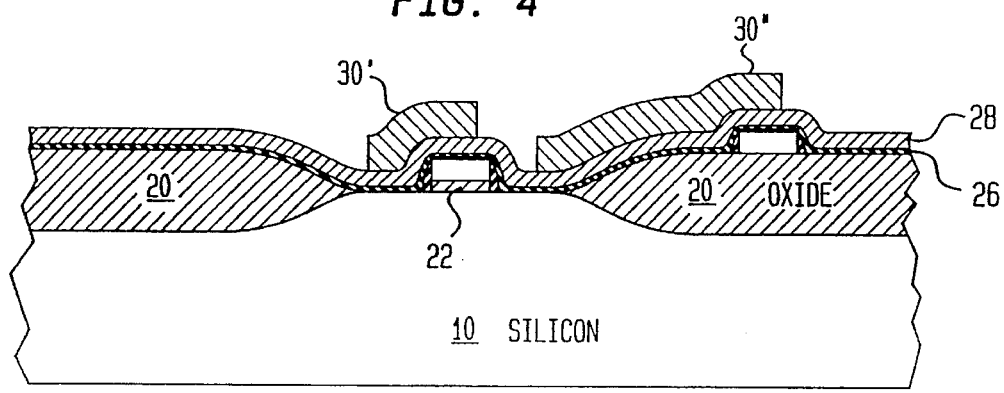

With reference to FIG. 4, a photoresist stencil, 30' and 30" is formed using the desired local interconnect pattern. A coating of a photosensitive layer is exposed using a local interconnect mask and the resist pattern is developed, baked and hardened using known methods.

Figure 5:
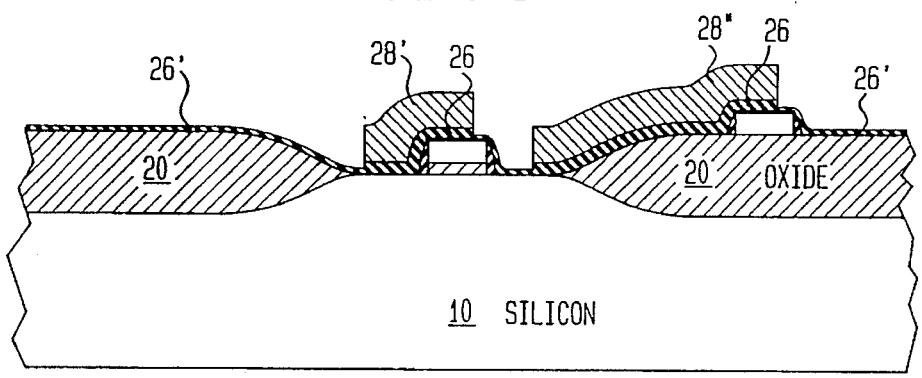

With reference to FIG. 5, layer 28 is etched using the stencil 30" and 30'. The etching can be done by using any, of a number of known processes singly or in combination, such as, reactive ion etching, ion milling, reactive ion beam etching, chemical wet etching etc. In all cases, layer 26 is used as an etch stop to avoid damaging the exposed device contact. A preferred reactive ion etching process for titanium that provide good selectivity to $SiO_2$ layer, uses Cl2, BCl3 and N2 as the gas constituents. Invariably, even the etch processes with good selectivity will cause some loss of the etch stop layer. In FIG. 5, the layer 26' is essentially the layer 26 that has become thinner during the etch process. The choice of the etch process and the thickness of layer 26 is selected to facilitate sufficient overetch to form the local interconnect without the "stringers" or shorts discussed earlier. With further reference to FIG. 5, the resist stencil 30' and 30" is removed by wet and or dry etching, preferably by plasma ashing followed by wet stripping.

Figure 6A:
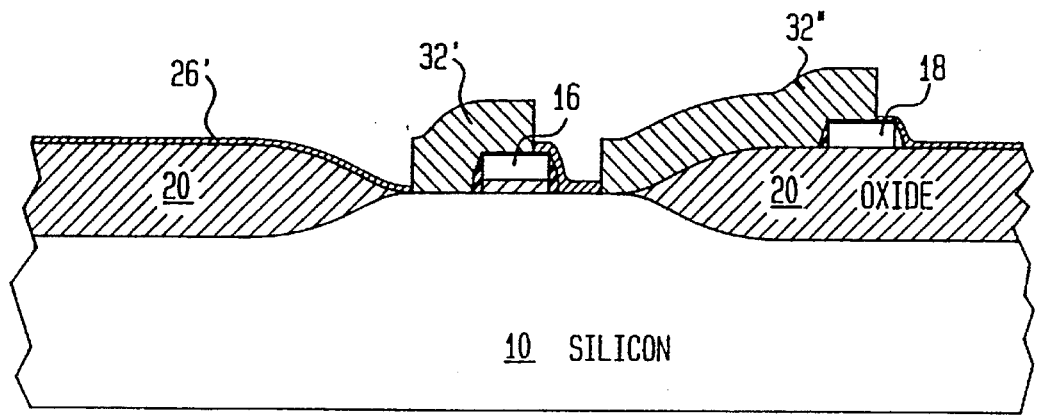
Figure 6B:
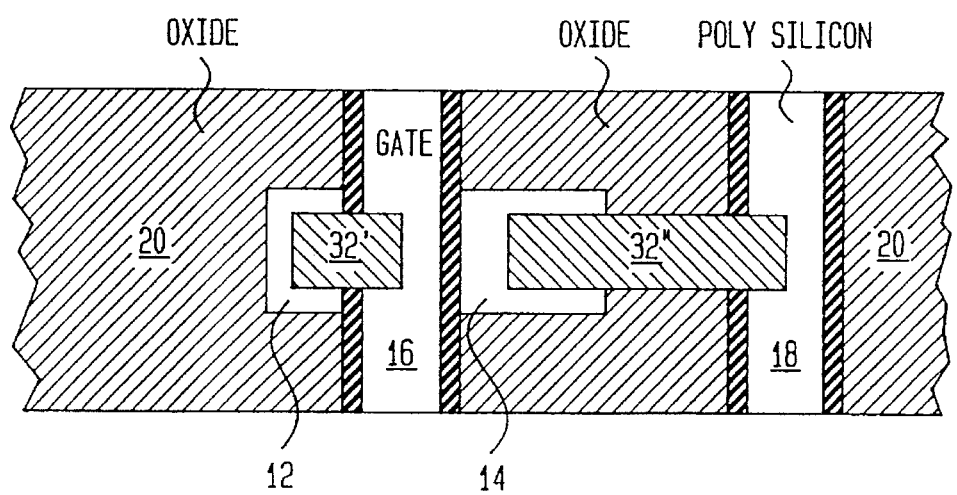
FIG. 6B is a top view of an element whose cross section is shown in FIG. 6A.

With reference to FIGS. 6A and 6B, the conductive straps 28' and 28" and layer 26 underneath them have been activated to form a new layer 32' and 32'. Layers 32' and 32" are conductive, make electrical contacts to the device surfaces and provide electrically conductive links between the devices. The electrical resistivity of the conducting links is in the range of 1 to 10 ohms/square depending on the devices being connected.

There is thus provided a method for forming a local interconnect, with the desirable attributes of good step coverage, minimal shorting, compatibility with borderless contact design and acceptable electrical conductivity. The process steps are easily integrated with conventional semiconductor manufacturing tools and techniques. The present invention has utility especially in the area of interconnection and improved wirability of semiconductor devices.

While the invention has been described in terms of a single preferred embodiment, various alternatives and modifications can be devised by those skilled in the art without departing from the invention. Accordingly, the present invention embraces all such alternatives and modifications which fall within the scope of the appended claims.

What is claimed is:

1. A method of manufacturing a local interconnection of devices on a semiconductor substrate, comprising:

providing a semiconductor substrate containing a plurality of devices and having a surface with contact openings to said devices;

providing an etch stop layer of silicon dioxide over said surface including said contact openings to said devices;

depositing a layer of conductor over said insulating layer;

patterning resist over said conductor layer;

defining said conductor layer through subtractive etching stopping on said etch stop layer; and, thermally activating said defined conductor and the underlying etch stop layer thereby altering said underlying etch stop layer from insulating to conducting.

2. The method of claim 1, wherein said silicon dioxide is selected in the thickness range of 50 to 200 angstroms.

3. The method of claim 1, wherein said conductor film comprises Ti.

4. The method of claim 1, wherein said thermal activation is achieved by one of rapid thermal annealing, isothermal heating and laser heating.

5. The method of claim 1, where said subtractive etching is done in a plasma discharge containing chlorine.

* * * * *